United States Patent
Park

(10) Patent No.: US 10,115,832 B2
(45) Date of Patent: Oct. 30, 2018

(54) THIN FILM TRANSISTOR, METHOD FOR MANUFACTURING THE SAME, ARRAY SUBSTRATE AND DISPLAY DEVICE

(71) Applicants: BOE TECHNOLOGY GROUP CO., LTD., Beijing (CN); HEFEI BOE OPTOELECTRONICS TECHNOLOGY CO., LTD., Anhui (CN)

(72) Inventor: Kuhyun Park, Beijing (CN)

(73) Assignees: BOE TECHNOLOGY GROUP CO. LTD., Beijing (CN); HEFEI BOE OPTOELECTRONICS TECHNOLOGY CO., LTD., Anhui (CN)

(*) Notice: Subject to any disclaimer, the term of this patent is extended or adjusted under 35 U.S.C. 154(b) by 0 days.

(21) Appl. No.: 15/317,251

(22) PCT Filed: Feb. 24, 2016

(86) PCT No.: PCT/CN2016/074429
§ 371 (c)(1),
(2) Date: Dec. 8, 2016

(87) PCT Pub. No.: WO2017/049862
PCT Pub. Date: Mar. 30, 2017

(65) Prior Publication Data
US 2017/0288060 A1    Oct. 5, 2017

(30) Foreign Application Priority Data
Sep. 23, 2015  (CN) .......................... 2015 1 0613453

(51) Int. Cl.
*H01L 29/10* (2006.01)
*H01L 29/786* (2006.01)
(Continued)

(52) U.S. Cl.
CPC ...... *H01L 29/7869* (2013.01); *H01L 27/1225* (2013.01); *H01L 29/66969* (2013.01); *H01L 29/78696* (2013.01)

(58) Field of Classification Search
CPC .......... H01L 29/7869; H01L 29/66969; H01L 29/78696; H01L 27/1225
See application file for complete search history.

(56) References Cited

U.S. PATENT DOCUMENTS

2010/0148170 A1* 6/2010 Ueda .................. H01L 29/7869
257/43
2011/0180803 A1 7/2011 Kim et al.
(Continued)

FOREIGN PATENT DOCUMENTS

CN 101047145 A 10/2007
CN 102136499 A 7/2011
(Continued)

OTHER PUBLICATIONS

Cheol Hyoun Ahn, Karuppanan Senthil, Hyung Koun Cho & Sang Yeol Lee, Artificial semiconductor/insulator superlattice channel structure for high-performance oxide thin-film transistors, Scientific Reports 3, Article No. 2737 (2013).*
(Continued)

*Primary Examiner* — Mark Tornow
(74) *Attorney, Agent, or Firm* — Brooks Kushman P.C.

(57) ABSTRACT

A TFT is provided. The TFT includes an active layer, and the active layer includes a first active layer and a second active layer. The second active layer is made of the oxide semiconductor material, and the first active layer has conductivity greater than conductivity of the second active layer.

14 Claims, 4 Drawing Sheets

(51) Int. Cl.
*H01L 29/66* (2006.01)
*H01L 27/12* (2006.01)

(56) References Cited

U.S. PATENT DOCUMENTS

| | | | | |
|---|---|---|---|---|
| 2012/0126223 | A1* | 5/2012 | Maeng | ............... H01L 29/7869 |
| | | | | 257/43 |
| 2012/0248446 | A1* | 10/2012 | Liu | .................. H01L 29/78618 |
| | | | | 257/59 |
| 2013/0001558 | A1* | 1/2013 | Okada | ................ H01L 29/7869 |
| | | | | 257/57 |
| 2014/0117347 | A1 | 5/2014 | Chiang et al. | |
| 2016/0005870 | A1 | 1/2016 | Huang et al. | |
| 2016/0027811 | A1 | 1/2016 | Li et al. | |
| 2017/0288060 | A1 | 10/2017 | Park | |

FOREIGN PATENT DOCUMENTS

| | | |
|---|---|---|
| CN | 102655165 A | 9/2012 |
| CN | 102891183 A | 1/2013 |
| CN | 103208525 A | 7/2013 |
| CN | 103500764 A | 1/2014 |
| CN | 103715269 A | 4/2014 |
| CN | 105280717 A | 1/2016 |
| JP | 2011243745 A | 12/2011 |

OTHER PUBLICATIONS

First Office Action for Chinese Application No. 201510613453.6, dated Sep. 4, 2017, 14 Pages.
International Search Report and Written Opinion for Application No. PCT/CN2016/074429, dated Jun. 24, 2016, 10 Pages.

* cited by examiner

THIN FILM TRANSISTOR, METHOD FOR MANUFACTURING THE SAME, ARRAY SUBSTRATE AND DISPLAY DEVICE

CROSS-REFERENCE TO RELATED APPLICATIONS

This application is the U.S. national phase of PCT Application No. PCT/CN2016/074429 filed on Feb. 24, 2016, which claims priority to Chinese Patent Application No. 201510613453.6 filed on Sep. 23, 2015, the disclosures of which are incorporated in their entirety by reference herein.

TECHNICAL FIELD

The present disclosure relates to the field of display technology, in particular to a thin film transistor (TFT), a method for manufacturing the same, an array substrate and a display device.

BACKGROUND

Along with the development of science and technology, there is increasing demand for liquid crystal display (LCD). Currently, a TFT-LCD, as a mainstream display, has been applied to such products as mobile phones and flat-panel computers.

The display quality of a display device depends on the performance of the TFT. For a conventional TFT, an active layer may be made of amorphous-silicon (a-Si) or an oxide semiconductor material. As compared with a-Si, the oxide semiconductor material may allow a visible light beam to pass therethrough, so it may be used to improve an aperture ratio and reduce the production cost.

However, during the manufacture of the active layer, its characteristic may be deteriorated in the case that the oxide semiconductor material is exposed to an external environment (e.g., moisture or oxygen). At this time, the mobility of the oxide semiconductor material may be degraded, and as a result, the performance of the TFT will be adversely affected.

SUMMARY

(1) Technical Problem to be Solved

An object of the present disclosure is to provide a TFT, a method for manufacturing the same, an array substrate and a display device, so as to prevent the performance of the TFT from being degraded in the case that the oxide semiconductor material is exposed to the external environment.

(2) Technical Solution

In one aspect, the present disclosure provides in some embodiments a TFT, including an active layer. The active layer includes a first active layer and a second active layer. The second active layer is made of an oxide semiconductor material, and the first active layer has conductivity greater than that of the second active layer.

Optionally, the active layer includes one first active layer and one second active layer.

Optionally, the TFT further includes a source electrode and a drain electrode, and the first active layer is arranged closer to the source electrode and the drain electrode than the second active layer.

Optionally, the TFT further includes a source electrode and a drain electrode, the second active layer is arranged closer to the source electrode and the drain electrode than the first active layer, and an etch stop layer is formed on a surface of the second active layer.

Optionally, the TFT further includes a source electrode and a drain electrode, and the active layer includes one first active layer and two second active layers. The first active layer is arranged between the two second active layers, and an etch stop layer is formed on a surface of the second active layer adjacent to the source electrode and the drain electrode.

Optionally, the first active layer is arranged at a position corresponding to a TFT channel.

Optionally, the first active layer is made of at least one material selected from the group consisting of indium tin oxide, indium zinc oxide, stannic dioxide, indium trioxide, zinc oxide and carbon nano tube.

Optionally, the second active layer is made of at least one material selected from the group consisting of indium gallium zinc oxide, cadmium oxide and aluminium oxide.

Optionally, the first active layer has a thickness of 100 Å to 4000 Å.

In another aspect, the present disclosure provides in some embodiments a method for manufacturing a TFT, including a step of forming an active layer on a base substrate. The step of forming the active layer on the base substrate includes forming a first active layer and a second active layer on the base substrate. The second active layer is made of an oxide semiconductor material, and the first active layer has conductivity greater than that of the second active layer.

Optionally, the step of forming the first active layer and the second active layer on the base substrate includes forming one first active layer and one second active layer on the base substrate.

Optionally, the method further includes forming a source electrode and a drain electrode on the base substrate, and the first active layer is arranged closer to the source electrode and the drain electrode than the second active layer.

Optionally, the method further includes forming a source electrode and a drain electrode on the base substrate. The second active layer is arranged closer to the source electrode and the drain electrode than the first active layer. Prior to the step of forming the source electrode and the drain electrode on the base substrate, the method further includes forming an etch stop layer on a surface of the second active layer.

Optionally, the method further includes forming a source electrode and a drain electrode on the base substrate. The step of forming the first active layer and the second active layer on the base substrate includes forming one first active layer and two second active layers on the base substrate. The first active layer is arranged between the two second active layers, and an etch stop layer is formed on a surface of the second active layer adjacent to the source electrode and the drain electrode.

Optionally, the first active layer is made of at least one material selected from the group consisting of indium tin oxide, indium zinc oxide, stannic dioxide, indium trioxide, zinc oxide and carbon nano tube.

Optionally, the second active layer is made of at least one material selected from the group consisting of indium gallium zinc oxide, cadmium oxide and aluminium oxide.

In yet another aspect, the present disclosure provides in some embodiments an array substrate including the above-mentioned TFT.

In still yet another aspect, the present disclosure provides in some embodiments a display device including the above-mentioned array substrate.

(3) Beneficial Effect

According to the TFT, a method for manufacturing the TFT, the array substrate and the display device in the embodiments of the present disclosure, the TFT includes the active layer which includes the first active layer and the second active layer. The second active layer is made of an oxide semiconductor material, and the first active layer has conductivity greater than that of the second active layer. In this way, the mobility of the second active layer made of the oxide semiconductor material may be reduced due to an external environment, and an electron transport speed of the first active layer having larger conductivity may be increased so as to compensate for the mobility of the entire active layer. As a result, it is able to prevent the performance of the TFT from being adversely affected.

BRIEF DESCRIPTION OF THE DRAWINGS

In order to illustrate the technical solutions of the present disclosure or the related art in a clearer manner, the drawings desired for the present disclosure or the related art will be described hereinafter briefly. Obviously, the following drawings merely relate to some embodiments of the present disclosure, and based on these drawings, a person skilled in the art may obtain the other drawings without any creative effort.

FIGS. 4a-4c are schematic views showing the steps of manufacturing the TFT in FIG. 2a.

Figure 1A:
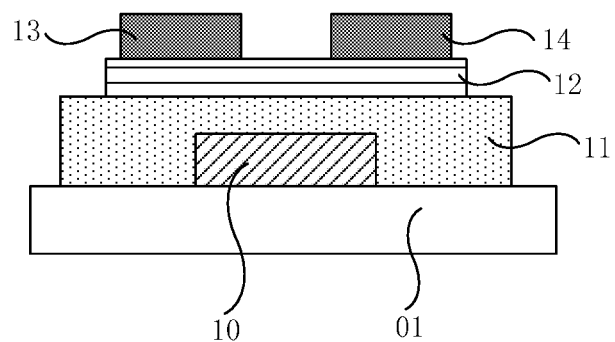
FIG. 1a is a schematic view showing a bottom-gate TFT according to one embodiment of the present disclosure.

REFERENCE SIGN LIST 01 base substrate
10 gate electrode
11 gate insulation layer
12 active layer
121 first active layer
122, 122' second active layer
13 source electrode
14 drain electrode
15 etch stop layer
16 passivation layer
17 pixel electrode

DETAILED DESCRIPTION OF THE EMBODIMENTS

In order to make the objects, the technical solutions and the advantages of the present disclosure more apparent, the present disclosure will be described hereinafter in a clear and complete manner in conjunction with the drawings and embodiments. Obviously, the following embodiments merely relate to a part of, rather than all of, the embodiments of the present disclosure, and based on these embodiments, a person skilled in the art may, without any creative effort, obtain the other embodiments, which also fall within the scope of the present disclosure.

Unless otherwise defined, any technical or scientific term used herein shall have the common meaning understood by a person of ordinary skills. Such words as "first" and "second" used in the specification and claims are merely used to differentiate different components rather than to represent any order, number or importance. Similarly, such words as "one" or "one of" are merely used to represent the existence of at least one member, rather than to limit the number thereof. Such words as "connect" or "connected to" may include electrical connection, direct or indirect, rather than to be limited to physical or mechanical connection. Such words as "on", "under", "left" and "right" are merely used to represent relative position relationship, and when an absolute position of the object is changed, the relative position relationship will be changed too.

The present disclosure provides in some embodiments a TFT including an active layer. The active layer includes a first active layer and a second active layer. The second active layer is made of an oxide semiconductor material, and the first active layer has conductivity greater than conductivity of the second active layer.

According to the embodiments of the present disclosure, the TFT includes the active layer which includes the first active layer and the second active layer. The second active layer is made of an oxide semiconductor material, and the first active layer has conductivity greater than that of the second active layer. In this way, the mobility of the second active layer made of the oxide semiconductor material may be reduced due to an external environment, and an electron transport speed of the first active layer having larger conductivity may be increased so as to compensate for the mobility of the entire active layer. As a result, it is able to prevent the performance of the TFT from being adversely affected.

At first, the descriptions are given as follows.

Figure 1B:
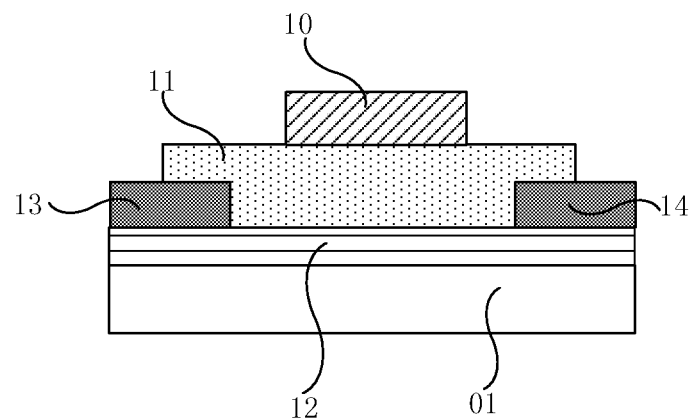
FIG. 1b is a schematic view showing a top-gate TFT according to one embodiment of the present disclosure.

Firstly, the type of the TFT is not particularly defined herein. For example, the TFT may be a bottom-gate TFT as shown in FIG. 1a. For the bottom-gate TFT, a gate electrode 10 is arranged closer to the base substrate 01 than a gate insulation layer 11. The active layer 12 is formed on a surface of the gate insulation layer 11, and a source electrode 13 and a drain electrode 14 are formed on a surface of the active layer 12. For another example, the TFT may be a top-gate TFT as shown in FIG. 1b. For the top-gate TFT, the gate electrode 10 is arranged farther away from the base substrate 01 than the gate insulation layer 11. The active layer 12 is formed on a surface of the base substrate 01, and the source electrode 13 and the drain electrode 14 are formed on the surface of the active layer.

For ease of description, the bottom-gate TFT is taken as an example in the following embodiments.

Secondly, the second active layer may be made of any oxide semiconductor material selected from the group consisting of cadmium oxide (CdO), aluminium oxide ($Al_2O_3$) and indium gallium zinc oxide (IGZO).

Figure 2A:
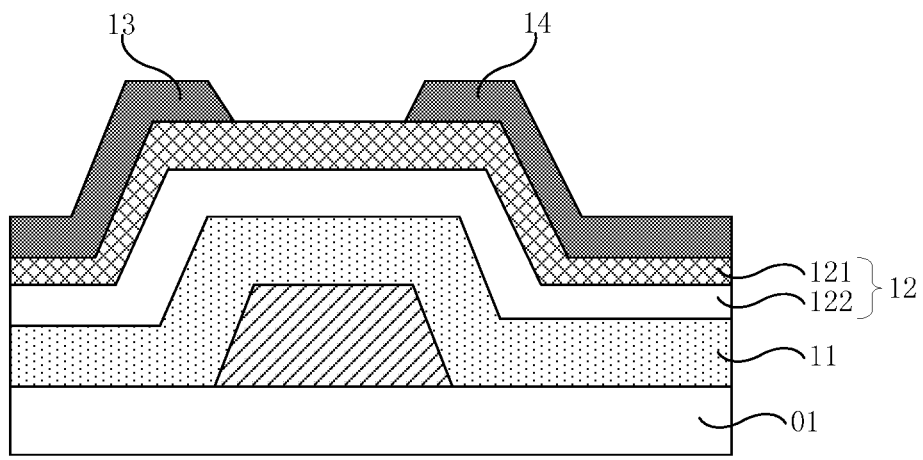
FIG. 2a is a schematic view showing the TFT in FIG. 1a where an active layer includes one first active layer and one second active layer.
Figure 2B:
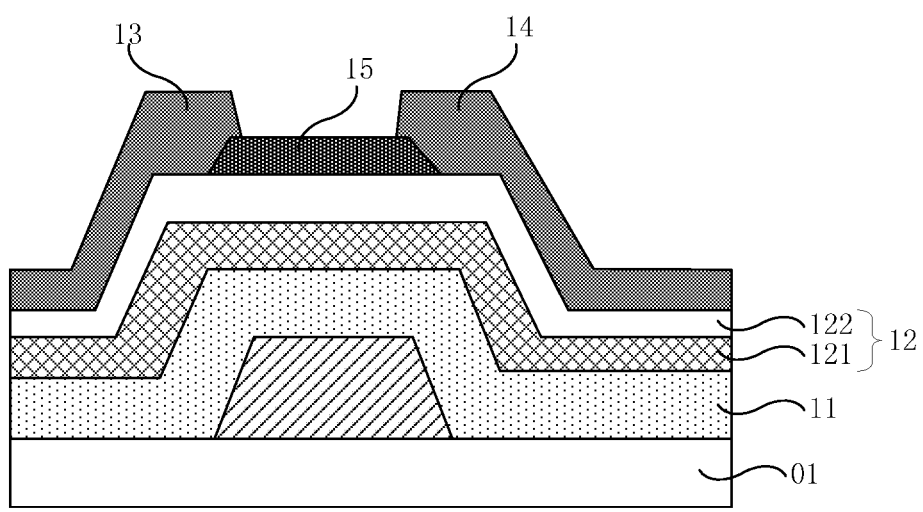
FIG. 2b is another schematic view showing the TFT in FIG. 1a where the active layer includes one first active layer and one second active layer.
Figure 3:
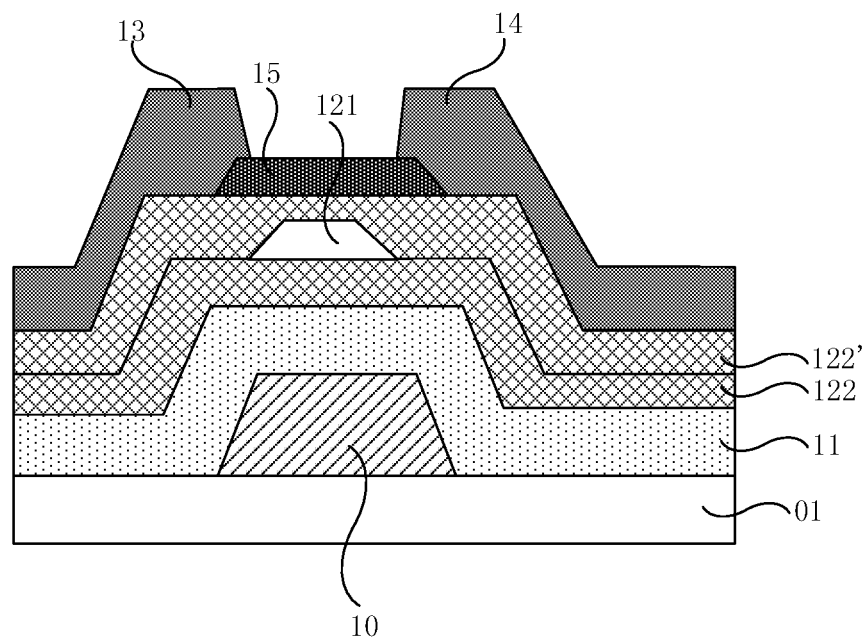
FIG. 3 is yet another schematic view showing the TFT in FIG. 1a where the active layer includes one first active layer and two second active layers.

Thirdly, the quantities of the first active layers 121 and the second active layers 122 (in FIG. 2a, 2b or 3) included in the active layer 12 is not particularly defined herein. For example, as shown in FIG. 2a, the active layer 12 includes one first active layer 121 and one second active layer 122. For another example, as shown in FIG. 3, the active layer 12 includes one first active layer 121 and two second active layers 122, 122'.

The active layer 12 of the TFT, which includes different quantities of the first active layers and the second active layers 122, will be described hereinafter in conjunction with the embodiments.

First Embodiment

In this embodiment, the active layer 12 includes one first active layer 121 and one second active layer 122. As shown in FIG. 2a, the first active layer 121 is arranged closer to the source electrode 13 and the drain electrode 14 than the second active layer 122.

To be specific, in the case that the first active layer 121 is arranged closer to the source electrode 13 and the drain electrode 14 than the second active layer 122 (i.e., the first active layer 121 is arranged at a surface of the second active layer 122), the first active layer 121 may be used to protect the second active layer 122, the mobility of which is susceptible to an external environment. As a result, during the manufacture of the source electrode 13 and the drain electrode 14, it is able to prevent moisture or oxygen in the external environment from being in direct contact with the second active layer 122, thereby to prevent the mobility of the second active layer 122 from being reduced.

For the material of the second active layer 122, e.g., CdO, $Al_2O_3$ or IGZO, an oxygen atom may be weakly bonded to a metal atom. However, in the case that the first active layer 121 is made of at least one material selected from the group consisting of indium tin oxide (InSnO), indium zinc oxide (InZnO), tin dioxide ($SnO_2$), indium oxide ($In_2O_3$), zinc oxide (ZnO) and carbon nano tube (CNT), the oxygen atoms in the second active layer 122 may be induced by the material of the first active layer 121 so as to be strongly bonded to the other atoms in the active layer 12, e.g., the metal atoms In and Sn. In this way, it is able to reduce the number of defects in the active layer 12 and weaken the defect's capability of capturing electrons, thereby to increase an electron transport speed and effectively improve the mobility of the active layer 12.

In addition, in the case that a pattern of the first active layer 121 is identical to a pattern of the second active layer 122, the patterns may be formed through a single masking and exposing process. To be specific, a second thin film made of at least one material selected from the group consisting of CdO, $Al_2O_3$ and IGZO may be coated onto a surface of the gate insulation layer 11, and then a first thin film made of at least one material selected from the group consisting of InSnO, InZnO, $SnO_2$, $In_2O_3$, ZnO and CNT may be coated onto a surface of the second thin film. Next, a photoresist maybe coated onto a surface of the first thin film, so as to form the patterns of the first active layer 121 and the second active layer 122 through a single masking and exposing process.

Second Embodiment

In this embodiment, the active layer 12 includes one first active layer 121 and one second active layer 122. Different from the first embodiment, as shown in FIG. 2b, the second active layer 122 is arranged closer to the source electrode 13 and the drain electrode 14 than the first active layer 121.

Based on the above, in order to prevent the performance of the second active layer 122 from being adversely affected by the moisture or oxygen from the external environment during the manufacture of the source electrode 13 and the drain electrode 14, an etch stop layer 15 may be arranged on a surface of the second active layer 122, so as to protect the second active layer 122 and enable the second active layer 122 to maintain its original mobility. In addition, the first active layer 121 below the second active layer 122 has mobility greater than the second active layer 122, so it is able to further improve the mobility of the entire active layer 12.

In addition, like that mentioned in the first embodiment, the first active layer 121 may also be made of at least one material selected from the group consisting of InSnO, InZnO, $SnO_2$, $In_2O_3$, ZnO and CNT, together with the same beneficial effect which will not be particularly defined herein.

Further, in order to simplify the manufacture procedure, the first active layer 121 and the second active layer 122 having an identical pattern may be formed through a single masking and exposing process.

Different from the first embodiment, the etch stop layer 15 may be formed on the surface of the second active layer 122 in this embodiment, so as to prevent the mobility of the second active layer 122 from being adversely affected by the external factors, thereby to provide the active layer 12 with higher mobility. In addition, in this embodiment, the second active layer 122 is in contact with the source electrode 13 and the drain electrode 14, and the second active layer 122 has conductivity smaller than that of the first active layer 121, so a leakage current of the TFT may be smaller than that of the TFT in the first embodiment. In a word, the TFT in this embodiment has relatively high mobility and a relatively small leakage current, and thus it has better performance.

However, due to the existence of the etch stop layer 15, it is necessary to provide an additional step of forming the etch stop layer 15 during the manufacture of the TFT, so the manufacture procedure thereof is relatively complex as compared with that in the first embodiment.

Third Embodiment

In this embodiment, as shown in FIG. 3, the active layer 12 may include one first active layer 121 and two second active layers 122, 122'.

The first active layer 121 is arranged between the second active layers 122 and 122', and the etch stop layer 15 is formed on a surface of the second active layer 122' adjacent to the source electrode 13 and the drain electrode 14. In this way, through the etch stop layer 15, it is able to protect the second active layer 122' in contact with the source electrode 13 and the drain electrode 14, thereby to prevent the performance of the second active layer 122' from being adversely affected by the external environment during the manufacture of the source electrode 13 and the drain electrode 14, and enable the second active layer 122' to maintain its original mobility. In addition, the first active layer 121 between the second active layers 122, 122' has mobility higher than the second active layers 122, 122', so it is able to further improve the mobility of the entire active layer 12.

In addition, because the second active layer 122' is in contact with the source electrode 13 and the drain electrode 14 and it has conductivity smaller than the first active layer 121, the TFT in this embodiment may have a relatively small leakage current. In a word, as compared with the TFT in the first embodiment, the TFT in this embodiment has relatively high mobility and a relatively small leakage current, and thus it has better performance.

However, due to the existence of the etch stop layer 15, it is necessary to provide an additional step of forming the etch stop layer 15 during the manufacture of the TFT, so the manufacture procedure thereof is relatively complex as compared with that in the first embodiment.

In addition, further descriptions will be given as follows.

Firstly, in this embodiment, a pattern of the first active layer 121 between the second active layers 122, 122' may be identical to the pattern of the second active layers 122, 122'. In this way, it is able to form the patterns of the first active layer 121 and the second active layers 122, 122' through a single masking and exposing process.

Optionally, as shown in FIG. 3, the first active layer 121 may be formed at a position corresponding to a TFT channel. In this way, in the case that the TFT is turned on, it is able for the first active layer 121 to increase the electron transport speed at the position corresponding to the TFT channel, thereby to provide the TFT with relatively high mobility. In addition, because the first active layer 121 is merely provided at the position corresponding to the TFT channel, it is able to save the material for the first active layer 121 while increasing the mobility of the TFT.

Secondly, like that mentioned in the first embodiment, the first active layer 121 may also be made of at least one material selected from the group consisting of InSnO, InZnO, $SnO_2$, $In_2O_3$, ZnO and CNT, together with the same beneficial effect which will not be particularly defined herein.

In addition, in any one of the above-mentioned embodiments, the first active layer 121 may have a thickness of 100 Å to 4000 Å. In the case that the thickness of the first active layer 121 is too small, e.g., less than 100 Å, the material of the first active layer 121 may not have an ability strong enough to induce the oxygen atoms in the second active layer 122 to be strongly bonded to the other atoms in the active layer 122, so it is impossible to effectively increase or compensate for the mobility of the entire active layer 12. In addition, in the case that the thickness of the first active layer 121 is too large, e.g., greater than 4000 Å, it is able to effectively increase or compensate for the mobility of the active layer 12, but it is adverse to the formation of a super-thin display device using the resultant TFT.

In addition, the present disclosure further provides in some embodiments a method for manufacturing the above-mentioned TFT, including a step of forming the active layer 12 on the base substrate 01. The step of forming the active layer 12 may include forming the first active layer 121 and the second active layer 122 on the base substrate 01. The second active layer 122 is made of an oxide semiconductor material, and the first active layer 121 has conductivity greater than the second active layer 122.

In this way, even in the case that the mobility of the second active layer made of the oxide semiconductor material is reduced due to the external environment, it is able for the first active layer having relatively large conductivity to increase the electron transport speed, thereby to compensate for the mobility of the entire active layer, thereby to prevent the performance of the TFT from being adversely affected.

In addition, further descriptions will be given as follows.

At first, the second active layer may be made of at least one oxide semiconductor material selected from the group consisting of CdO, $Al_2O_3$ and IGZO, and the first active layer 121 may be made of at least one material selected from the group consisting of InSnO, InZnO, $SnO_2$, $In_2O_3$, ZnO and CNT, together with the same beneficial effect as that mentioned in the first embodiment, which will not be particularly defined herein.

Secondly, in the embodiments of the present disclosure, the patterning process may include a photoetching process (which includes an etching step), and any other processes, e.g., printing and ink-jetting, for forming a predetermined pattern. The photoetching process refers to a process for forming a pattern through film-forming, exposing and developing using a photoresist, a mask plate and an exposure machine. The corresponding patterning process may be selected in accordance with the structure to be formed in the embodiments of the present disclosure.

In the embodiments of the present disclosure, the desired pattern may be formed through a single patterning process, i.e., by forming different exposed regions through a single masking and exposing process and then subjecting the exposed regions to such removing processes as etching and ashing for many times.

In the embodiments of the present disclosure, the quantities of the first active layers 121 and the second active layers 122 included in the active layer 12 (as shown in FIG. 2a, 2b or 3) may not be particularly defined. The manufacture procedure of the TFT will be described hereinafter in conjunction with the embodiments, in the case that the active layer 12 of the TFT includes different quantities of the first active layers 121 and the second active layers 122.

Fourth Embodiment

In this embodiment, the active layer includes one first active layer 121 and one second active layer 122.

Figure 4A:
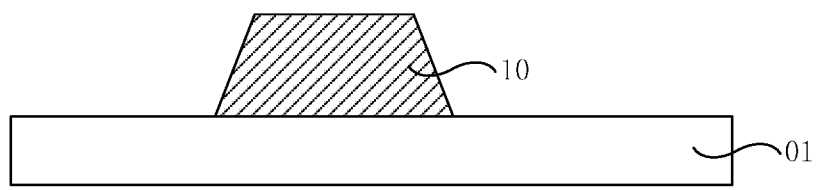

To be specific, as shown in FIG. 4a, a gate metal layer may be formed on the base substrate 01, and a photoresist may be applied onto a surface of the gate metal layer, so as to form a pattern of the gate electrode 10 through a masking and exposing process.

Figure 4B:
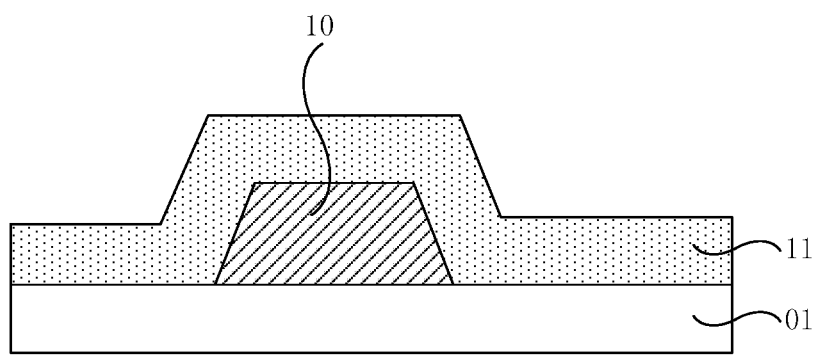

Next, the gate insulation layer 11 may be formed on the base substrate 01. To be specific, as shown in FIG. 4b, the gate insulation layer 11 may be applied onto a surface of the gate electrode 10.

Figure 4C:
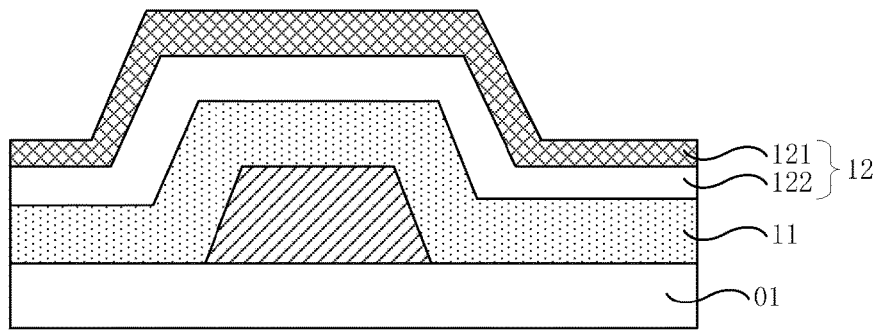

Next, as shown in FIG. 4c, one first active layer 121 and one second active layer 122 may be formed on the base substrate 01. To be specific, a second thin film made of at least one material selected from the group consisting of CdO, $Al_2O_3$ and IGZO may be applied onto a surface of the gate insulation layer 11, and a first thin film made of at least one material selected from the group consisting of InZnO, $SnO_2$, $In_2O_3$, ZnO and CNT may be applied onto a surface of the second thin film. Then, a photoresist may be applied onto a surface of the first thin film, so as to form patterns of the first active layer 121 and the second active layer 122 through a single masking and exposing process.

Finally, a source-drain metal layer may be applied onto a surface of the first active layer 121, and a photoresist may be applied onto a surface of the source-drain metal layer, so as to form patterns of the source electrode 13 and the drain electrode 14 in FIG. 2a through a masking and exposing process. The first active layer 121 is arranged closer to the source electrode 13 and the drain electrode 14 than the second active layer 122. In this way, the first active layer 121 is arranged on a surface of the second active layer 122, so the first active layer 121 may be used to protect the second active layer 122, the mobility of which is susceptible to an external environment. As a result, during the manufacture of the source electrode 13 and the drain electrode 14, it is able to prevent the moisture or oxygen in the external environment from being in direct contact with the second active layer 122, thereby to prevent the mobility of the second active layer 122 from being reduced.

Optionally, the step of forming one first active layer 121 and one second active layer 122 on the base substrate 01 may further include forming the first thin film on the surface of the gate insulation layer 11, and then forming the second thin film, so as to form the patterns of the first active layer 121 and the second active layer 122 through a single masking and exposing process. Next, a pattern of the etch stop layer 15 may be formed on the surface of the second active layer 122 through a single patterning process. Through the etch stop layer 15, it is able to protect the second active layer in contact with the source electrode 13 and the drain electrode 14, thereby to prevent the performance of the second active layer 122 from being degraded due to the external environment, i.e., enable the second active layer 122 to maintain its original mobility, during the manufacture of the source electrode 13 and the drain electrode 14. Finally, the source-drain metal layer may be applied to a surface of the etch stop layer 15, and a photoresist may be applied onto a surface of the source-drain metal layer, so as to form the patterns of the source electrode 13 and the drain electrode 14 in FIG. 2b through a masking and exposing process. The second active layer 122 is arranged closer to the source electrode 13 and the drain electrode 14 than the first active layer 121. Through the etch stop layer 15 on the surface of the second active layer 122, it is able to protect the second active layer 122, and enable the second active layer 122 to maintain its original mobility. In addition, because the first active layer 121 under the second active layer 122 has relatively large mobility, it is able to further increase the mobility of the entire active layer 12.

Fifth Embodiment

In this embodiment, the active layer 12 may include one first active layer 121 and two second active layers 122, 122'.

To be specific, as shown in FIG. 3, the gate electrode 10 and the gate insulation layer 11 may be formed sequentially on a surface of the base substrate 01 through patterning processes.

Next, one first active layer 121 and two second active layers 122, 122' may be formed on a surface of the gate insulation layer 11, and the first active layer 121 may be arranged between the two second active layers 122, 122'. To be specific, a second thin film made of at least one material selected from the group consisting of CdO, $Al_2O_3$ and IGZO may be applied onto a surface of the gate insulation layer 11, a first thin film made of at least one material selected from the group consisting of InZnO, $SnO_2$, $In_2O_3$, ZnO and CNT may be applied onto a surface of the second thin film, and then another second film layer may be applied onto the first thin film, so as to form one first active layer 121 and two second active layers 122, 122' having an identical pattern through a single patterning process.

Optionally, the step of forming one first active layer 121 and two second active layers 122, 122' on the surface of the gate insulation layer 11 may include: forming the second thin film on the surface of the gate insulation layer 11 so as to form the pattern of the second active layer 122 through a single patterning process, applying the first thin film onto the surface of the second active layer 122 so as to form the pattern of the first active layer 121 through a single patterning process at a position corresponding to the TFT channel, and applying the other second thin film onto the surface of the base substrate provided with the first active layer 121 and the second active layer 122 so as to form the pattern of the second active layer 122' through a single patterning process.

As compared from the manufacture procedure where the first active layer 121 and the second active layers 122, 122' have an identical pattern, the manufacture procedure in FIG. 3 is relatively complex. However, because the first active layer 121 is merely formed at the position corresponding to the TFT channel, it is able to save the material of the first active layer 121 while increasing the mobility of the TFT.

Next, a pattern of the etch stop layer 15 may be formed on the substrate provided with the active layer 12 through a patterning process, so as to protect the second active layer 122' (which is arranged adjacent to the source electrode 13 and the drain electrode 14), thereby to prevent the mobility of the second active layer 122' from being adversely affected due to the external environment.

Finally, patterns of the source electrode 13 and the drain electrode 14 may be formed on the substrate provided with the etch stop layer 15 through a patterning process.

Figure 5:
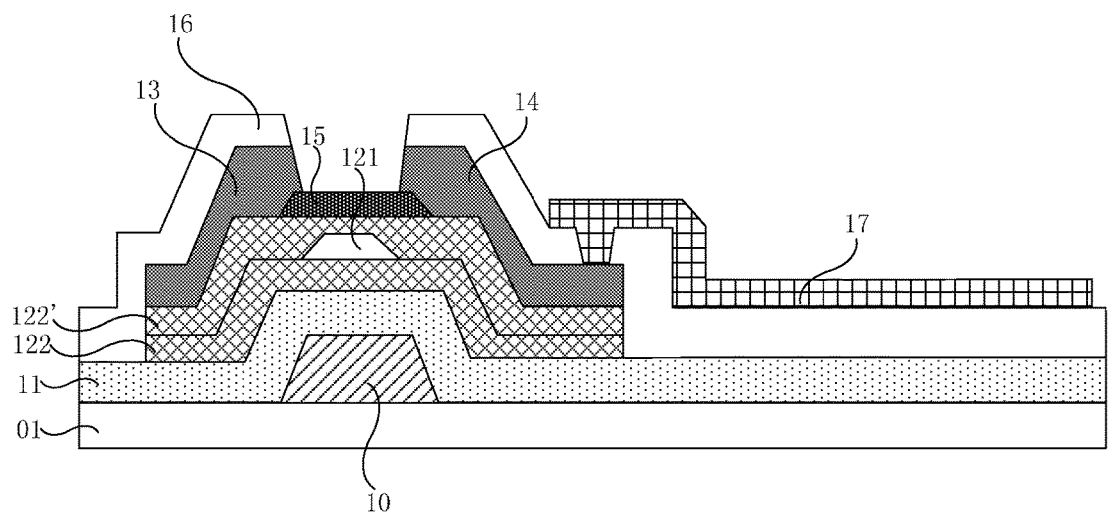
FIG. 5 is a schematic view showing an array substrate including the TFT in FIG. 3.

The present disclosure further provides in some embodiments an array substrate including the above-mentioned TFT. As shown in FIG. 5, the array substrate further includes a passivation layer 16 on surfaces of the source electrode 13 and the drain electrode 14, and a pixel electrode 17 on a surface of the passivation layer 16. The pixel electrode 17 is connected to the drain electrode 14 of the TFT through a via-hole in the passivation layer 16. In this way, in the case that the TFT is turned on, a signal may be applied from the source electrode 13 to the pixel electrode 17 via the drain electrode 14, so as to charge the pixel electrode 17, thereby to display an image at different grayscales in accordance with a charging level.

It should be appreciated that, the TFT included in the array substrate has a structure and a beneficial effect identical to that mentioned above, which will not be particularly defined herein.

The present disclosure provides in some embodiments a display device including the above-mentioned array substrate. The display device may be a liquid crystal display device. For example, the display device may be any product or member having a display function, such as a liquid crystal display, a liquid crystal television, a digital photo frame, a mobile phone or a flat-panel computer. The structure of the array substrate has been described hereinbefore, and thus will not be particularly defined herein.

The above are merely the preferred embodiments of the present disclosure, but the present disclosure is not limited thereto. Obviously, a person skilled in the art may make further modifications and improvements without departing from the spirit of the present disclosure, and these modifications and improvements shall also fall within the scope of the present disclosure.

What is claimed is:

1. A thin film transistor (TFT), comprising an active layer, wherein the active layer includes a first active layer and two second active layers, the second active layer is made of an oxide semiconductor material, and the first active layer has conductivity greater than conductivity of the second active layer; wherein the TFT further comprises a base substrate, a source electrode and a drain electrode, wherein at least one of the at least one second active layer is, relative to the first active layer, closer to a portion of the source electrode and the drain electrode of which an orthogonal projection onto the base substrate overlaps orthogonal projections of the first active layer and the two second active layers onto the base substrate;

wherein the first active layer is arranged between the two second active layers, and the two second active layers are in contact with each other.

2. The TFT according to claim 1, wherein an etch stop layer is formed on a surface of at least one of the two second active layers.

3. The TFT according to claim 1, wherein an etch stop layer is formed on a surface of the second active layer adjacent to the source electrode and the drain electrode.

4. The TFT according to claim 1, wherein the first active layer is arranged at a position corresponding to a TFT channel.

5. The TFT according to claim 1, wherein the first active layer is made of at least one material selected from the group consisting of indium tin oxide, indium zinc oxide, stannic dioxide, indium trioxide, zinc oxide and carbon nano tube, and the second active layer is made of at least one material selected from the group consisting of indium gallium zinc oxide, cadmium oxide and aluminium oxide.

6. The TFT according to claim 1, wherein the first active layer has a thickness of 100 Å to 4000 Å.

7. An array substrate, comprising the TFT according to claim 1.

8. A display device, comprising the array substrate according to claim 7.

9. The TFT according to claim 1, wherein the orthogonal projection of the first active layer onto the base substrate is within the orthogonal projections of the two second active layers onto the base substrate.

10. A method for manufacturing a thin film transistor (TFT), comprising a step of forming an active layer on a base substrate, wherein the step of forming the active layer on the base substrate comprises forming a first active layer and two second active layers on the base substrate, the second active layer is made of an oxide semiconductor material, and the first active layer has conductivity greater than conductivity of the second active layer; wherein
the method further comprises forming a source electrode and a drain electrode on the base substrate, wherein at least one of the at least one second active layer is, relative to the first active layer, closer to a portion of the source electrode and the drain electrode of which an orthogonal projection onto the base substrate overlaps orthogonal projections of the first active layer and the two second active layers onto the base substrate;
wherein the first active layer is arranged between the two second active layers, and the two second active layers are in contact with each other.

11. The method according to claim 10, wherein the orthogonal projection of the first active layer onto the base substrate is within the orthogonal projections of the two second active layers onto the base substrate.

12. The method according to claim 10, wherein prior to the step of forming the source electrode and the drain electrode on the base substrate, the method further comprises forming an etch stop layer on a surface of at least one of the two second active layers.

13. The method according to claim 10, wherein an etch stop layer is formed on a surface of the second active layer adjacent to the source electrode and the drain electrode.

14. The method according to claim 10, wherein the first active layer is made of at least one material selected from the group consisting of indium tin oxide, indium zinc oxide, stannic dioxide, indium trioxide, zinc oxide and carbon nano tube, and the second active layer is made of at least one material selected from the group consisting of indium gallium zinc oxide, cadmium oxide and aluminium oxide.

* * * * *